United States Patent
Lin et al.

(10) Patent No.: US 12,437,929 B2
(45) Date of Patent: Oct. 7, 2025

(54) CAPACITOR WITH AN ELECTRICALLY CONDUCTIVE LAYER COUPLED WITH A METAL LAYER OF THE CAPACITOR

(71) Applicant: Intel Corporation, Santa Clara, CA (US)

(72) Inventors: Chia-Ching Lin, Portland, OR (US); Kaan Oguz, Portland, OR (US); Sou-Chi Chang, Portland, OR (US); Arnab Sen Gupta, Hillsboro, OR (US); I-Cheng Tung, Hillsboro, OR (US); Ian A. Young, Olympia, WA (US); Matthew V. Metz, Portland, OR (US); Uygar E. Avci, Portland, OR (US); Sudarat Lee, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 864 days.

(21) Appl. No.: 17/484,949

(22) Filed: Sep. 24, 2021

(65) Prior Publication Data
US 2023/0098594 A1 Mar. 30, 2023

(51) Int. Cl.
*H01G 4/30* (2006.01)
*H01G 4/08* (2006.01)
*H01G 4/35* (2006.01)
*H10D 1/68* (2025.01)

(52) U.S. Cl.
CPC ............... *H01G 4/30* (2013.01); *H01G 4/08* (2013.01); *H01G 4/35* (2013.01); *H10D 1/692* (2025.01)

(58) Field of Classification Search
None
See application file for complete search history.

(56) References Cited

U.S. PATENT DOCUMENTS

| 6,177,351 | B1 * | 1/2001 | Beratan | H01L 21/7687 |
| | | | | 257/E21.585 |
| 6,222,722 | B1 * | 4/2001 | Fukuzumi | H01L 28/82 |
| | | | | 257/E21.018 |
| 6,329,234 | B1 * | 12/2001 | Ma | H01L 28/60 |
| | | | | 257/E21.018 |

(Continued)

FOREIGN PATENT DOCUMENTS

| CN | 107924954 B | * 12/2020 | ....... H01L 29/66181 |
| EP | 4016653 | 6/2022 | |
| JP | 2021111784 A | * 8/2021 | ........... C01G 33/006 |

OTHER PUBLICATIONS

EP4016653 (Year: 2022).*
Extended European Search Report for European Patent Application No. 22197335.7 mailed Feb. 20, 2023, 7 pages.

*Primary Examiner* — Dion R. Ferguson
(74) *Attorney, Agent, or Firm* — Schwabe, Williamson & Wyatt P.C.

(57) ABSTRACT

Embodiments described herein may be related to apparatuses, processes, and techniques related MIM capacitors that have a multiple trench structure to increase a charge density, where a dielectric of the MIM capacitor includes a perovskite-based material. In embodiments, a first electrically conductive layer may be coupled with a top metal layer of the MIM, and/or a second conductive layer may be coupled with a bottom metal layer of the MIM to reduce RC effects. Other embodiments may be described and/or claimed.

24 Claims, 8 Drawing Sheets

(56) References Cited

U.S. PATENT DOCUMENTS

| | | | | |
|---|---|---|---|---|
| 6,617,206 | B1* | 9/2003 | Sandhu | H01L 28/91 |
| | | | | 438/770 |
| 8,486,800 | B2* | 7/2013 | Liu | C23C 18/1254 |
| | | | | 438/386 |
| 8,487,405 | B2* | 7/2013 | Tian | H01L 29/945 |
| | | | | 257/532 |
| 2007/0040204 | A1* | 2/2007 | Pulugurtha | H01G 4/33 |
| | | | | 257/303 |
| 2019/0393298 | A1* | 12/2019 | Lin | H10D 84/813 |
| 2023/0087624 | A1* | 3/2023 | Oguz | H01L 28/65 |
| | | | | 257/532 |
| 2023/0098594 | A1* | 3/2023 | Lin | H01G 4/35 |
| | | | | 361/301.4 |

* cited by examiner

CAPACITOR WITH AN ELECTRICALLY CONDUCTIVE LAYER COUPLED WITH A METAL LAYER OF THE CAPACITOR

FIELD

Embodiments of the present disclosure generally relate to the field of semiconductor packaging, and in particular to capacitors within dies or packages.

BACKGROUND

Continued growth in virtual machines, cloud computing, and portable devices will continue to increase the demand for high density power delivery within chips and packages.

DETAILED DESCRIPTION

Figure 1A:
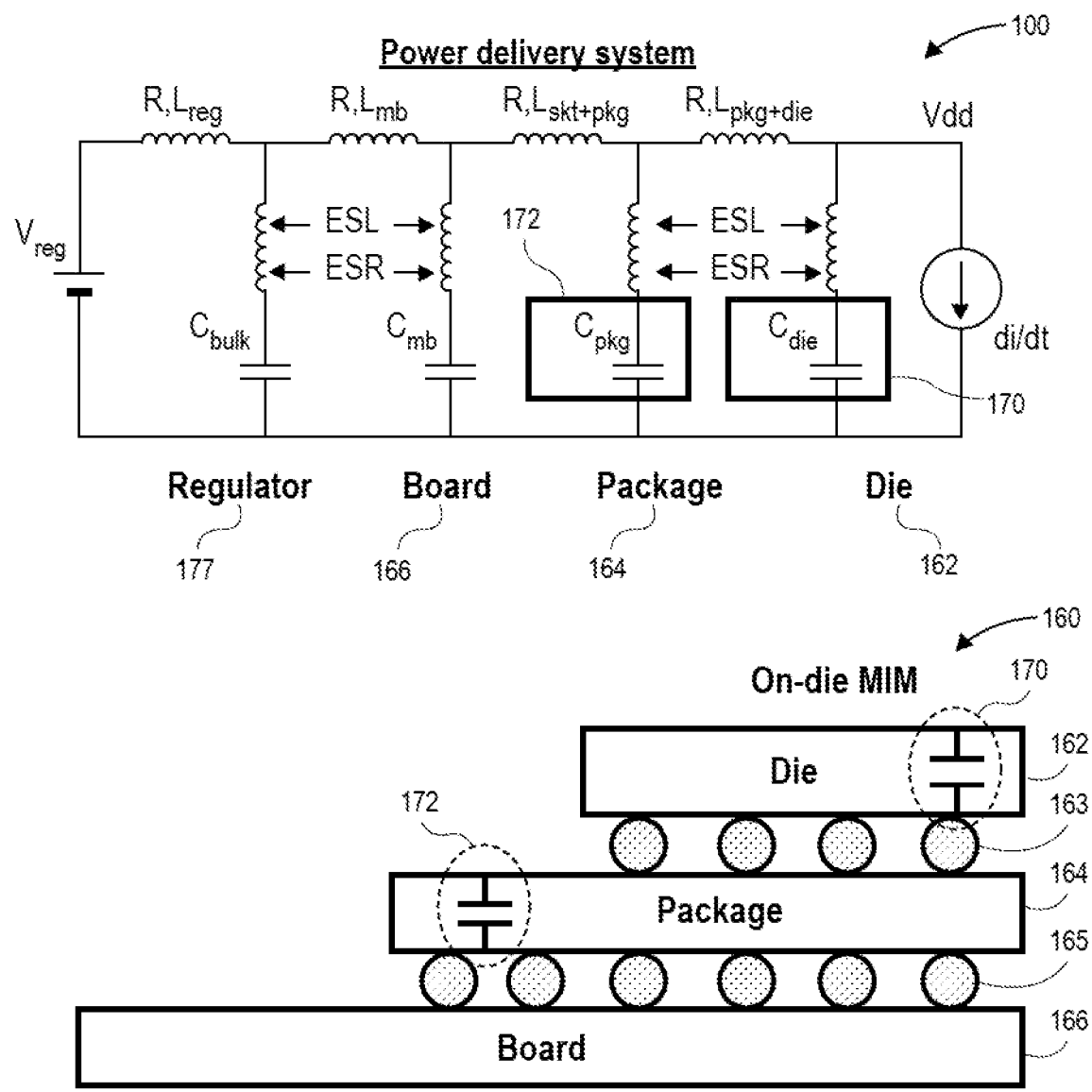
FIGS. 1A-1B illustrate a schematic and a block diagram that shows metal-insulator-metal (MIM) capacitors within a die and a package.

Embodiments described herein may be related to apparatuses, processes, and techniques directed to MIM capacitors that have a multiple trench structure to increase a charge density, where a dielectric of the MIM capacitor includes a perovskite-based high-k (dielectric constant) material. In embodiments, a first conductive layer, such as a conductive metal, may be coupled with a top metal layer of the MIM, and/or a second conductive layer may be coupled with a bottom metal layer of the MIM. In embodiments, the first conductive layer may be electrically coupled with the top metal layer, and the second conductive layer may be electrically coupled with the bottom metal layer. In embodiments, the first conductive layer may extend the length of the top metal layer, and the second conductive layer may extend the length of the bottom metal layer. In embodiments, the top metal layer may be referred to as a first metal layer and a top electrode, and the bottom metal layer may be referred to as a second metal layer or a bottom electrode.

To increase the charge density of a MIM capacitor, a multiple trench structure may be used to increase the overall surface area of the active portion of the MIM capacitor. This may be done by narrowing the distances between the trenches, which may be referred to as increasing the density of the trenches, and/or increasing the height of the trenches. This increases the surface area to which the top metal layer, dielectric, and bottom metal layer are applied. However, by narrowing the distances between the trenches, during operation a resistor-capacitor (RC) effect on the MIM will be larger.

In embodiments, by applying a first conductive layer to the top metal layer to extend the top metal layer, and a second conductive layer to the bottom metal layer to extend the bottom metal layer, the RC effect may be reduced by 100 times or more.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1B:
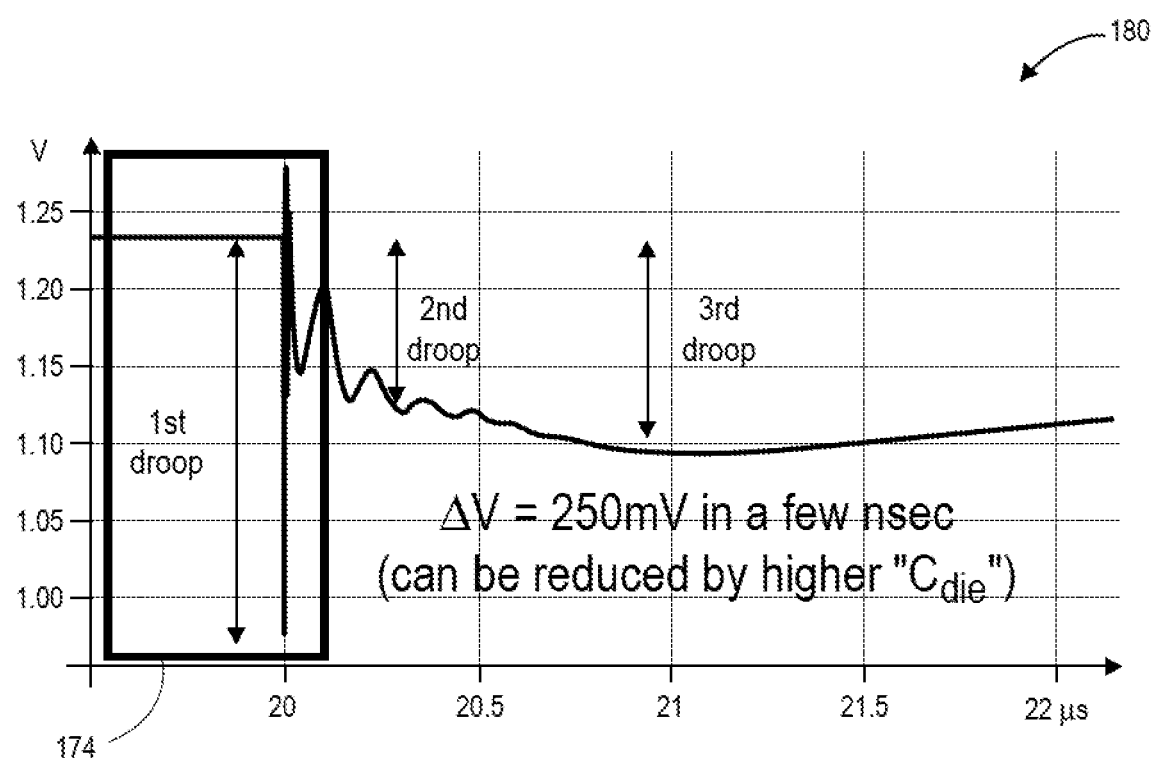

FIGS. 1A-1B illustrate a schematic and a block diagram that shows metal-insulator-metal (MIM) capacitors within a die and a package. FIG. 1A illustrates a block diagram that shows MIM capacitors from regulator to die. FIG. 1B illustrates a schematic that shows MIM capacitors within a die and a package. With respect to FIG. 1A, diagram 100 is a schematic that shows a portion of various circuitry associated with the components of the system 160. In particular, die 162 may be electrically coupled with package 164 using interconnect 163. The package 164 may be electrically coupled with a printed circuit board (PCB) 166 using interconnect 165. In embodiments, PCB 166 may be a motherboard. Note that a voltage regulator 177 (not shown in FIG. 1B) may be used to provide power to the die 162, the package 164, and/or the PCB 166.

A capacitor 170, which in embodiments may be a MIM capacitor, may be included on the die 162. In other embodiments, another capacitor 172, which in embodiments may be a MIM capacitor, may also be included on the package 164. In embodiments, the capacitors 170, 172 may be multiple capacitors that provide a higher capacitance density that may minimize a first droop during load switching, as shown with respect to highlighted area 174 of graph 180. With respect to FIG. 1B, graph 180 shows a relationship between voltage and time (in microseconds), with respect to various voltage droops. For example, if there is no on die MIM, the power from the regulator to microprocessor will be delayed, which may result in a first voltage drop as large as 250 mV, degrading microprocessor performance. There is an advantage to an on die MIM two-story charge near transistors in order to supply a charge to the die faster.

Figure 2:
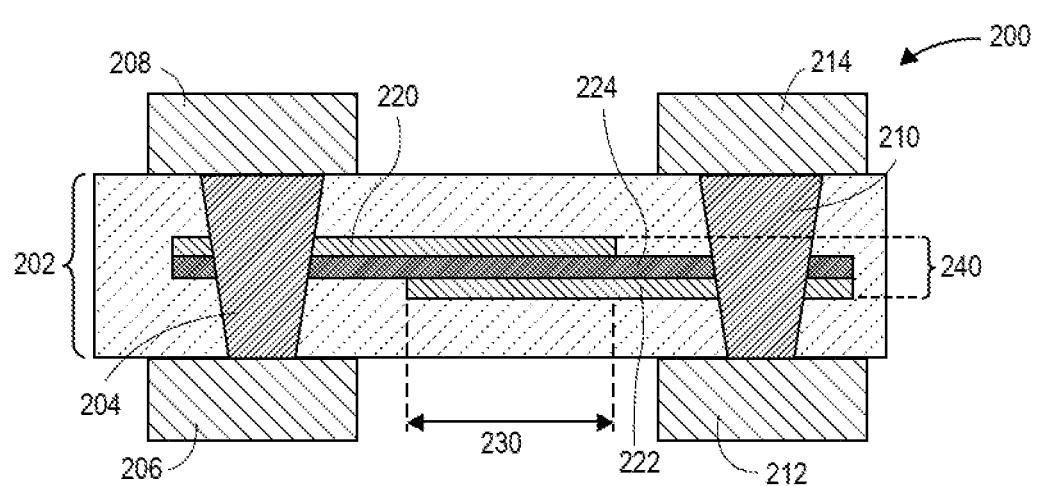
FIG. 2 illustrates a block diagram of a cross-section of a two plate MIM capacitor using perovskite-based high-k materials, in accordance with various embodiments.

FIG. 2 illustrates a block diagram of a cross-section of a two plate MIM capacitor using perovskite-based high-k materials, in accordance with various embodiments. MIM 200 includes a first metal layer 220 and a second metal layer 222 that are separated by dielectric 224. In embodiments, dielectric 224 may be a perovskite-based high-k dielectric. The first metal layer 220, the layers of dielectric 224, and the second metal layer 222 may be referred to as a MIM stack.

The first metal layer 220 may be electrically coupled with a first electrical contact 204 which may be electrically and/or physically coupled with pads 206, 208 on either side of a core 202. Similarly, the second metal layer 222 may be electrically coupled with a second electrical contact 210 which may be electrically and/or physically coupled with pads 212, 214 on either side of the core 202. As shown, an area of overlap 230 where the first metal layer 220 and the second metal layer 222 overlap, may be referred to as an active portion of the MIM stack 240. In embodiments, the area of overlap 230 may form an area of at least 50 μm×50 μm. In embodiments, the pads 206, 208, 212, 214 may be on two different metal layers on the top of a die, for example that may be within (not shown) die 162 of FIG. 1A.

Figure 3:
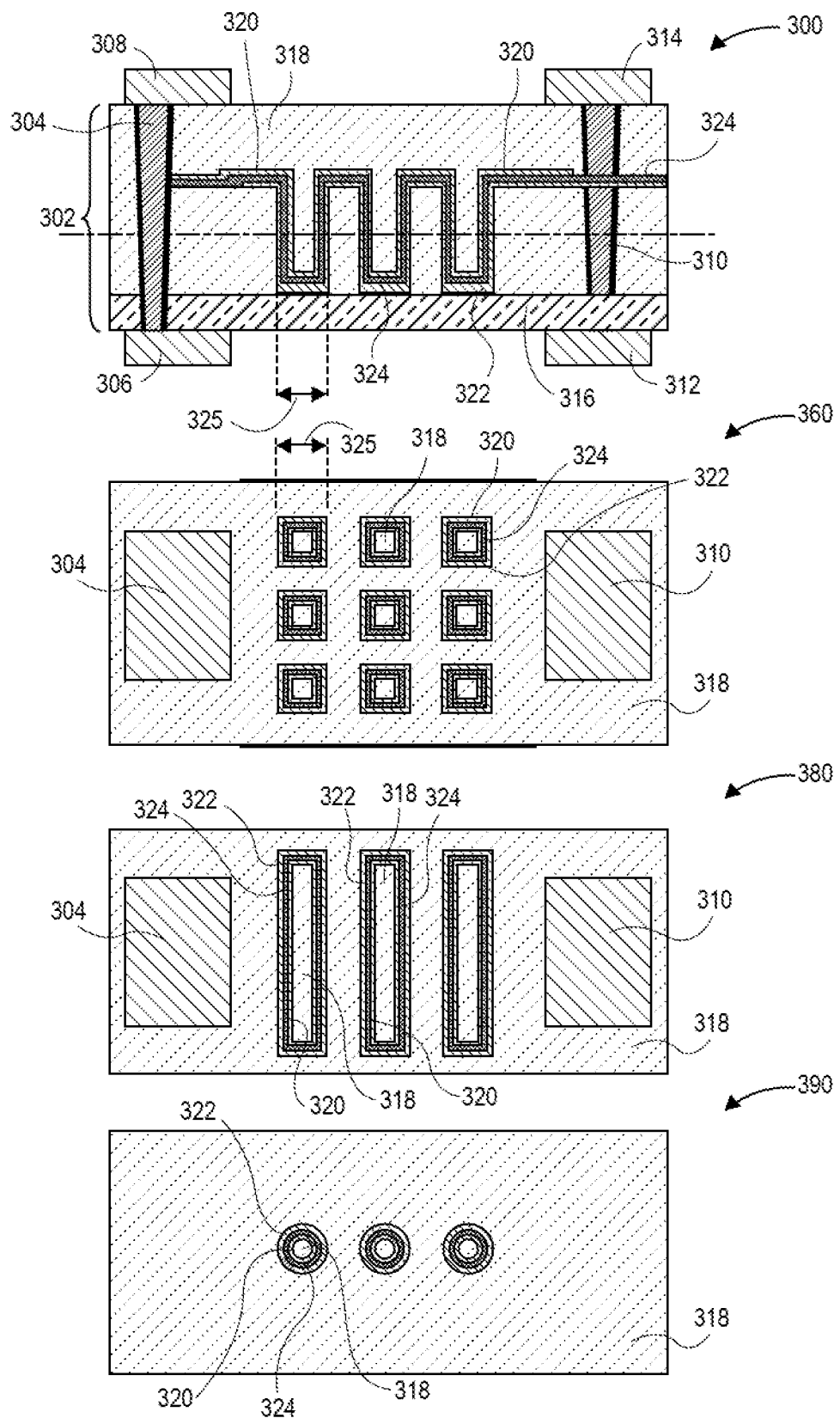
FIG. 3 illustrates a cross section side view and various top-down views of a capacitor within a core, in accordance with various embodiments.

FIG. 3 illustrates a cross section side view and various top-down views of a capacitor within a core, in accordance with various embodiments. Diagram 300 shows a cross section side view of a MIM that includes a first metal layer 320 and a second metal layer 322 that are separated by dielectric 324, which may be similar to first metal layer 222, second metal layer 220, and dielectric 224 of FIG. 2. The first metal layer 320 may be electrically coupled with a first electrical contact 304, which may be electrically and/or physically coupled with pads 306, 308 on either side of a core 302, which may be similar to first electrical contact 204, and pads 206, 208 of FIG. 2. The second metal layer 322 may be electrically coupled with a second electrical contact 310, which may be electrically and/or physically coupled with pads 312, 314 on either side of the core 302, which may be similar to second electrical contact 210, and pads 212, 214 of FIG. 2.

In embodiments, the core 302 may include a first insulator 316 and a second insulator 318 that surrounds the first metal layer 320, second metal layer 322, and dielectric 324. In embodiments, the first insulator 316 and the second insulator 318 may be made of the same or similar materials. In embodiments, the diagram 300 may show a part of a MIM capacitor on a die structure, such as a CPU, or may be part of another component of a package, for example on a substrate of a package.

In embodiments, the dielectric 324 may include one or more perovskite layers that include one or more of: strontium, barium, hafnium, zirconium, aluminum, cobalt, lanthanum, tin, oxygen, $SrTiO_3$, $BaTiO_3$, $BaHfO_3$, $BaZrO_3$, $LaAlO_3$, $LaCoO_3$, or $SrSnO_3$. In embodiments, the first metal layer 320 and the second metal layer 322, which may also be referred to as a first electrode layer 320 and a second electrode layer 322, may include one or more of ruthenium, molybdenum, rhodium, tungsten, platinum, rhenium, iridium, and oxygen.

As shown in diagram 300, the MIM may be fashioned in a structure that includes one or more trenches 325 to increase the overall area of the capacitive device. By using one or more trenches 325, a charge density may be improved by increasing the overall surface area of the first metal layer 320, the second metal layer 322, and dielectric 324. As discussed further below, the number of trenches 325 may be greatly increased, and a distance between the trenches 325 decreased in order to increase overall capacitance.

Diagram 360 shows a top-down cross section view at the dashed line of diagram 300 that includes the first electrical contact 304 and the second electrical contact 310. Examples of trenches 325 may include multiple structures in an array, each with first metal layer 320, layers of dielectric 324, and second metal layer 322 that may surround the second insulator 318.

Diagram 380 shows a different top-down cross section view where the features that form the trenches 325 may be long rectangles that include first metal layer 320, layers of dielectric 324, and second metal layer 322 that may surround the second insulator 318.

Diagram 390 shows a different top-down cross section view with the features that form the trenches 325 may be circular (as shown), or may be elliptical, that include first metal layer 320, layers of dielectric 324, and second metal layer 322 that may surround the second insulator 318. It should be appreciated that the MIM first metal layer 320, layers of dielectric 324, and second metal layer 322 may take on a variety of different shapes depending upon the size and performance characteristics desired of the MIM capacitor, as discussed further below.

Figure 4:
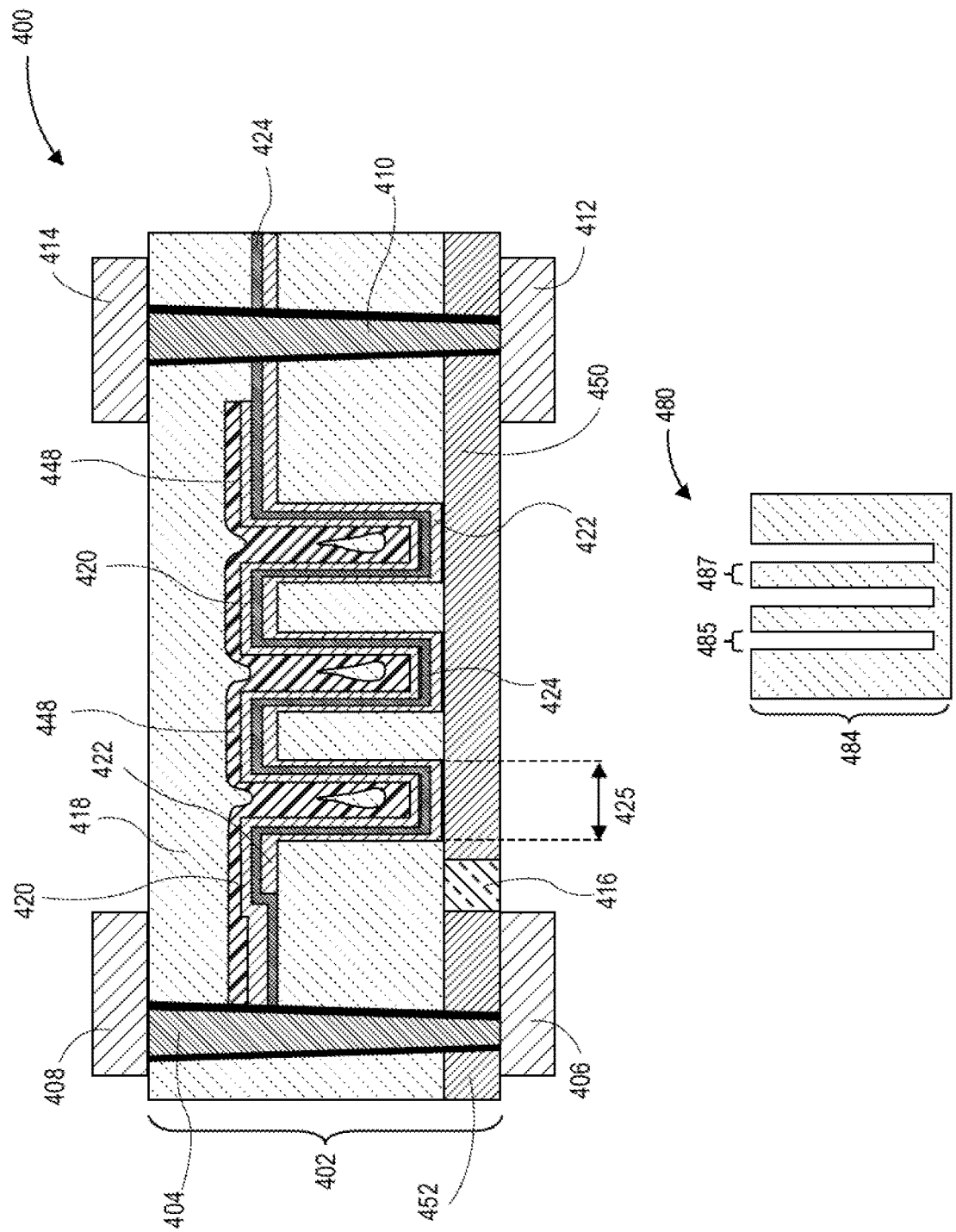
FIG. 4 illustrates cross section side views of an electrically conductive layer on a metal layer of a capacitor, in accordance with various embodiments.

FIG. 4 illustrates cross section side views of an electrically conductive layer on a metal layer of a capacitor, in accordance with various embodiments. Diagram 400, which may be similar to diagram 300 of FIG. 3, shows a cross section side view of a MIM that includes a first metal layer 420 and a second metal layer 422 that are separated by dielectric 424, which may be similar to first metal layer 320, second metal layer 322, and dielectric 324 of FIG. 3. The first metal layer 420 may be electrically coupled with a first electrical contact 404, which may be electrically and/or physically coupled with pads 406, 408 on either side of a core 402, which may be similar to first electrical contact 304, and pads 306, 308 of FIG. 3. The second metal layer 422 may be electrically coupled with a second electrical contact 410, which may be electrically and/or physically coupled with pads 412, 414 on either side of the core 402, which may be similar to second electrical contact 310, and pads 312, 314 of FIG. 3.

In embodiments, the core 402 may include a first insulator 416 and a second insulator 418 that surrounds a portion of the first metal layer 420, second metal layer 422, and dielectric 424, which may be similar to core 302, first insulator 316, and second insulator 318 of FIG. 3. In embodiments, the first insulator 316 and the second insulator 318 may be made of the same or similar materials. In embodiments, the diagram 400 may show a part of a MIM capacitor on a die structure, such as a CPU, or may be part of another component of a package, for example on a substrate of a package.

In embodiments, a first metal line 448, which may also be referred to as a first conductive layer, may be placed on top of and may be electrically coupled with the first metal layer 420. The first metal line 448 may be electrically coupled with the first electrical contact 404. In embodiments, the first metal line 448 may extend an entire length of, or a partial length of the first metal layer 420. In embodiments, the first metal line 448 may not completely fill the trenches 425.

In embodiments, a second metal line 450, which may also be referred to as a second conductive layer, may be placed on the bottom of and may be electrically coupled with the second metal layer 422. The second metal line 450 may be electrically coupled with the second electrical contact 410. In embodiments, the second metal line 450 may extend an entire length of, or a partial length of the second metal layer 422. As shown, the second metal line 450 couples with the second metal layer 422 at the bottom of trenches 425.

During operation, the long length of the dielectric layer 424, in combination with the multiple trenches 425, may run into RC effect complications, particularly when run in the gigahertz (GHz) range. By adding the first metal line 448 and/or the second metal line 450, the overall resistance may be reduced by a factor of 100 or more.

As shown in diagram 480, the RC effect may be exacerbated when trenches 485 and a space between trenches 487 are particularly narrow. In addition, a height of the trenches 484 may also contribute to an increased RC effect. These effects may be mitigated by adding the first metal line 448 and the second metal line 450 as described above.

Figure 5:
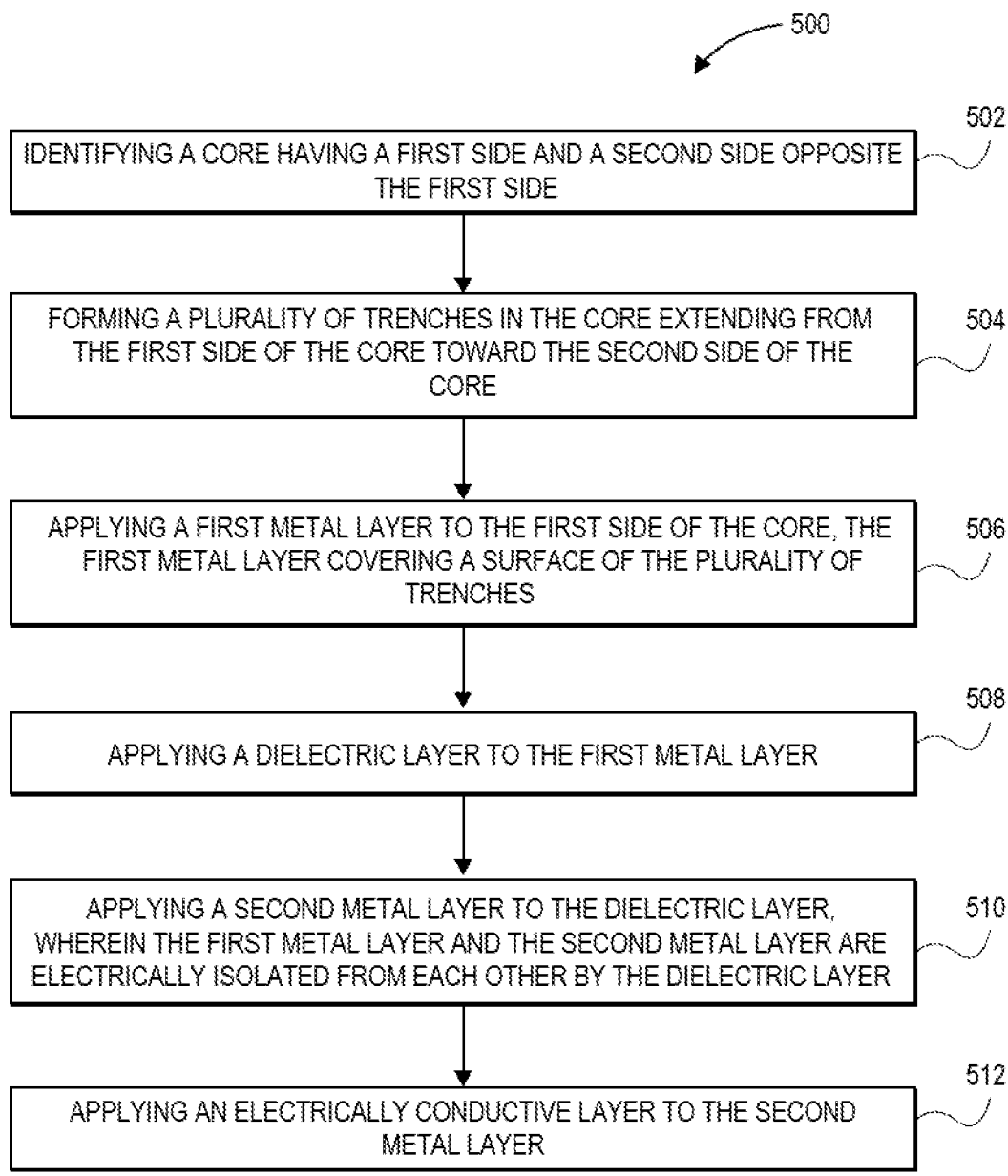
FIG. 5 illustrates an example process for manufacturing a capacitor that has an electrically conductive layer on a metal layer of the capacitor, in accordance with various embodiments.

FIG. 5 illustrates an example process for manufacturing a capacitor that has an electrically conductive layer on a metal layer of the capacitor, in accordance with various embodiments.

At block 502, the process may include identifying a core having a first side and a second side opposite the first side.

At block 504, the process may further include forming a plurality of trenches in the core extending from the first side of the core toward the second side of the core.

At block 506, the process may further include applying a first metal layer to the first side of the core, the first metal layer covering a surface of the plurality of trenches.

At block 508, the process may further include applying a dielectric layer to the first metal layer.

At block 510, the process may further include applying a second metal layer to the dielectric layer, wherein the first metal layer and the second metal layer are electrically isolated from each other by the dielectric layer.

At block 512, the process may further include applying an electrically conductive layer to the second metal layer.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or gate-all-around transistors such as nanoribbon and nanowire transistors. Although the implementations described herein may illustrate only Finfet transistors, it should be noted that the invention may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
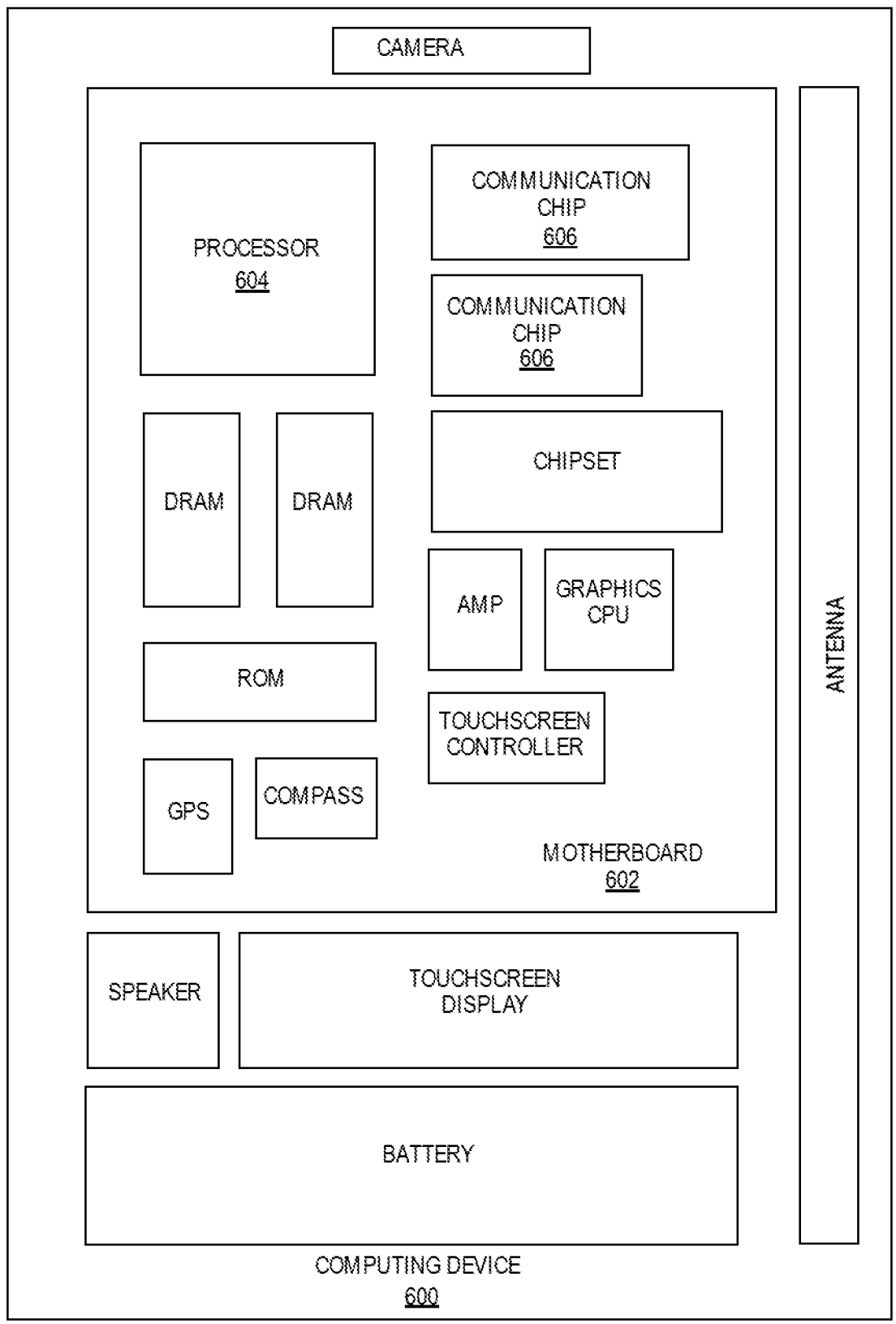
FIG. 6 illustrates a computing device 600 in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
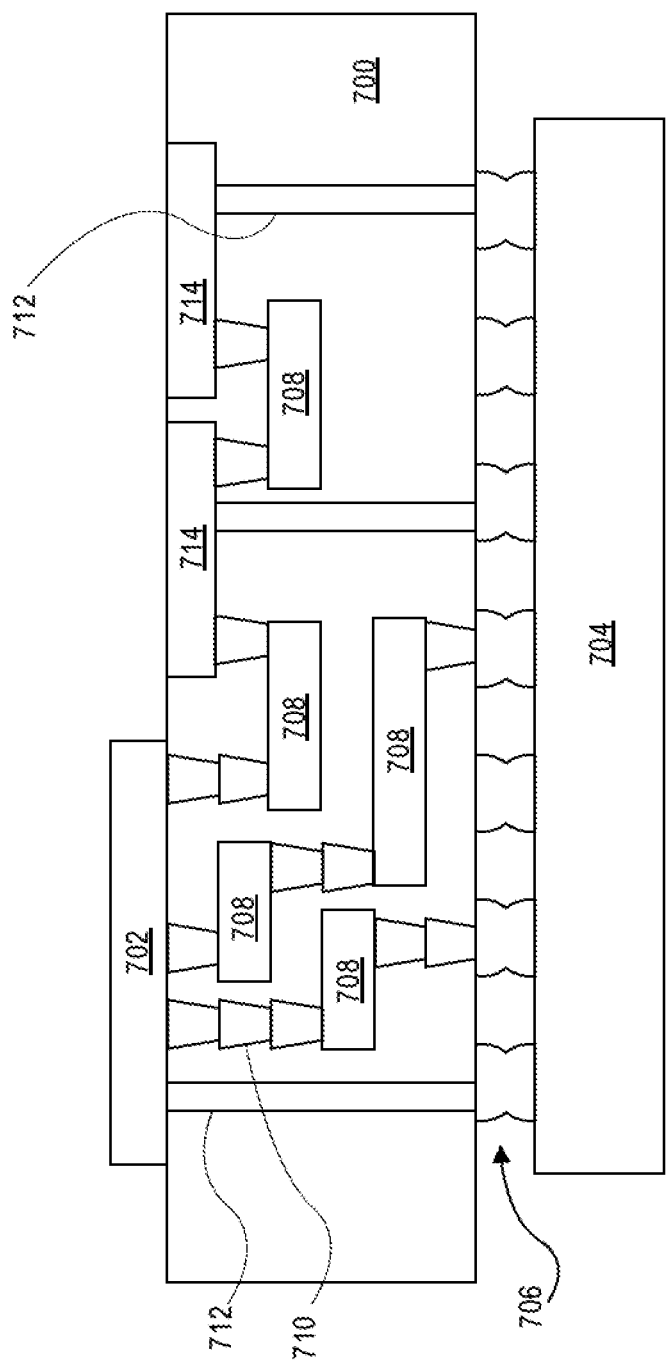
FIG. 7 illustrates an interposer 700 that includes one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a capacitor comprising: a first metal layer with a first side and a second side opposite the first side; a perovskite layer with a first side and a second side opposite the first side, the first side of the perovskite layer physically coupled with the second side of the first metal layer; a second metal layer with a first side and a second side opposite the first side, the first side of the second metal layer physically coupled with the second side of the perovskite layer, wherein the first metal layer and the second metal layer are electrically isolated from each other by the perovskite layer; and an electrically conductive layer coupled with the second side of the second metal layer, the electrically conductive layer electrically coupled with a voltage source.

Example 2 includes the capacitor of example 1, wherein the perovskite layer includes a selected one or more of: strontium, barium, hafnium, zirconium, aluminum, cobalt, lanthanum, tin, oxygen, SrTiO3, BaTiO3, BaHfO3, BaZrO3, LaAlO3, LaCoO3, or SrSnO3.

Example 3 includes the capacitor of example 1, wherein the first metal layer or the second metal layer included a selected one of: ruthenium, molybdenum, rhodium, tungsten, platinum, rhenium, and oxygen.

Example 4 includes the capacitor example 1, wherein the electrically conductive layer and the second metal layer are electrically coupled with the voltage source.

Example 5 includes the capacitor of any one of examples 1-4, wherein the first metal layer, the perovskite layer, and the second metal layer form a plurality of trenches.

Example 6 includes the capacitor example 5, wherein a spacing between troughs of the plurality of trenches is 1 um or less.

Example 7 includes the capacitor of example 5, wherein the electrically conductive layer uniformly covers the second metal layer.

Example 8 includes the capacitor of example 5, wherein the electrically conductive layer is a first electrically conductive layer, and wherein the voltage source is a first voltage source; and further comprising a second electrically conductive layer coupled with the first side of the first metal layer, wherein the second electrically conductive layer is electrically coupled with a second voltage source.

Example 9 includes the capacitor of example 8, wherein the first voltage source and the second voltage source are separate and distinct voltage sources; and wherein the first metal layer is electrically coupled with the second voltage source.

Example 10 includes the capacitor of example 8, wherein the second electrically conductive layer is physically coupled with at least a portion of a bottom of the plurality of trenches.

Example 11 is a method comprising: identifying a core having a first side and a second side opposite the first side; forming a plurality of trenches in the core extending from the first side of the core toward the second side of the core;

applying a first metal layer to the first side of the core, the first metal layer covering a surface of the plurality of trenches; applying a dielectric layer to the first metal layer; applying a second metal layer to the dielectric layer, wherein the first metal layer and the second metal layer are electrically isolated from each other by the dielectric layer; and applying an electrically conductive layer to the second metal layer.

Example 12 includes the method of example 11, wherein the first metal layer or the second metal layer included a selected one of: ruthenium, molybdenum, rhodium, tungsten, platinum, rhenium, and oxygen.

Example 13 includes the method of example 11, wherein the dielectric layer is a perovskite layer that includes a selected one or more of: strontium, barium, hafnium, zirconium, aluminum, cobalt, lanthanum, tin, oxygen, SrTiO3, BaTiO3, BaHfO3, BaZrO3, LaAlO3, LaCoO3, or SrSnO3.

Example 14 includes the method of example 11, wherein forming the plurality of trenches further includes forming the plurality of trenches wherein a spacing between troughs of the plurality of trenches is 1 um or less.

Example 15 includes the method of example 11, wherein the electrically conductive layer is applied uniformly on the second metal layer.

Example 16 includes the method of example 11, wherein the electrically conductive layer is a first electrically conductive layer; and further comprising, after identifying the core, applying a second electrically conductive layer to the second side of the core; and wherein forming the plurality of trenches in the core extending from the first side of the core toward the second side of the core further includes forming a plurality of trenches in the core extending from the first side of the core to the second electrically conductive layer.

Example 17 includes the method of example 16, wherein the first electrically conductive layer and the second electrically conductive layer are electrically isolated from each other.

Example 18 includes the method of example 16, further comprising: forming a first electrical contact in the core, the first electrical contact electrically coupling the second metal layer and the first electrically conductive layer; and forming a second electrical contact into the core, the second electrical contact electrically coupling the first metal layer and the second electrically conductive layer, wherein the first electrical contact is electrically isolated from the second electrical contact.

Example 19 includes the method of example 11, wherein the core is a selected one of: a glass core or a silicon core.

Example 20 includes the method of example 11, wherein applying the dielectric layer further includes applying the dielectric layer using atomic layer deposition (ALD).

Example 21 includes the method of any one of examples 11-20, wherein the first metal layer, the second metal layer, or the electrically conductive layer include copper.

Example 22 is a system comprising: a substrate; a first electrical connector coupled with the substrate; a second electrical connector coupled with the substrate; a capacitor coupled with the substrate, the capacitor comprising: a first metal layer with a first side and a second side opposite the first side; a perovskite layer with a first side and a second side opposite the first side, the first side of the perovskite layer physically coupled with the second side of the first metal layer; a second metal layer with a first side and a second side opposite the first side, the first side of the second metal layer physically coupled with the second side of the perovskite layer, wherein the first metal layer and the second metal layer are electrically isolated from each other by the perovskite layer; a first electrically conductive layer coupled with the second side of the second metal layer, the electrically conductive layer electrically coupled with the first electrical connector; and a second electrically conductive layer coupled with the first side of the first metal layer, wherein the second electrically conductive layer is electrically coupled with the second electrical connector.

Example 23 includes the system of example 22, wherein the first metal layer, the perovskite layer, and the second metal layer form a plurality of trenches; and wherein a spacing between troughs of the plurality of trenches is 1 um or less.

Example 24 includes the system of example 22, wherein the first electrically conductive layer uniformly covers the second metal layer, and wherein the second electrically conductive layer uniformly covers the first metal layer, and wherein the first electrically conductive layer and the second electrically conductive layer are electrically isolated.

Example 25 includes the system of any one of examples 22-24, wherein the perovskite layer includes a selected one or more of: strontium, barium, hafnium, zirconium, aluminum, cobalt, lanthanum, tin, oxygen, SrTiO3, BaTiO3, BaHfO3, BaZrO3, LaAlO3, LaCoO3, or SrSnO3; and wherein the first metal layer or the second metal layer included a selected one of: ruthenium, molybdenum, rhodium, tungsten, platinum, rhenium, and oxygen.

What is claimed is:

1. A capacitor comprising:
   a first metal layer with a first side and a second side opposite the first side;
   a perovskite layer with a first side and a second side opposite the first side, the first side of the perovskite layer physically coupled with the second side of the first metal layer;
   a second metal layer with a first side and a second side opposite the first side, the first side of the second metal layer physically coupled with the second side of the perovskite layer, wherein the first metal layer and the second metal layer are electrically isolated from each other by the perovskite layer, and wherein the second metal layer has an end that extends laterally beyond an end of the first metal layer; and
   an electrically conductive layer coupled with the second side of the second metal layer, the electrically conductive layer electrically coupled with a voltage source.

2. The capacitor of claim 1, wherein the perovskite layer includes a selected one or more of: strontium, barium, hafnium, zirconium, aluminum, cobalt, lanthanum, tin, oxygen, SrTiO3, BaTiO3, BaHfO3, BaZrO3, LaAl03, LaCoO3, or SrSnO3.

3. The capacitor of claim 1, wherein the first metal layer or the second metal layer included a selected one of: ruthenium, molybdenum, rhodium, tungsten, platinum, rhenium, and oxygen.

4. The capacitor claim 1, wherein the electrically conductive layer and the second metal layer are electrically coupled with the voltage source.

5. The capacitor of claim 1, wherein the first metal layer, the perovskite layer, and the second metal layer form a plurality of trenches.

6. The capacitor of claim 5, wherein a spacing between troughs of the plurality of trenches is 1 um or less.

7. The capacitor of claim 5, wherein the electrically conductive layer uniformly covers the second metal layer.

8. The capacitor of claim 5, wherein the electrically conductive layer is a first electrically conductive layer, and wherein the voltage source is a first voltage source; and further comprising:
a second electrically conductive layer coupled with the first side of the first metal layer, wherein the second electrically conductive layer is electrically coupled with a second voltage source.

9. The capacitor of claim 8, wherein the second electrically conductive layer is physically coupled with at least a portion of a bottom of the plurality of trenches.

10. A method comprising:
identifying a core having a first side and a second side opposite the first side;
forming a plurality of trenches in the core extending from the first side of the core toward the second side of the core;
applying a first metal layer to the first side of the core, the first metal layer covering a surface of the plurality of trenches;
applying a dielectric layer to the first metal layer;
applying a second metal layer to the dielectric layer, wherein the first metal layer and the second metal layer are electrically isolated from each other by the dielectric layer, and wherein the second metal layer has an end that extends laterally beyond an end of the first metal layer; and
applying an electrically conductive layer to the second metal layer.

11. The method of claim 10, wherein the first metal layer or the second metal layer included a selected one of: ruthenium, molybdenum, rhodium, tungsten, platinum, rhenium, and oxygen.

12. The method of claim 10, wherein the dielectric layer is a perovskite layer that includes a selected one or more of: strontium, barium, hafnium, zirconium, aluminum, cobalt, lanthanum, tin, oxygen, SrTiO3, BaTiO3, BaHfO3, BaZrO3, LaAl03, LaCoO3, or SrSnO3.

13. The method of claim 10, wherein forming the plurality of trenches further includes forming the plurality of trenches wherein a spacing between troughs of the plurality of trenches is 1um or less.

14. The method of claim 10, wherein the electrically conductive layer is applied uniformly on the second metal layer.

15. The method of claim 10, wherein the electrically conductive layer is a first electrically conductive layer; and further comprising, after identifying the core, applying a second electrically conductive layer to the second side of the core; and wherein forming the plurality of trenches in the core extending from the first side of the core toward the second side of the core further includes forming a plurality of trenches in the core extending from the first side of the core to the second electrically conductive layer.

16. The method of claim 15, wherein the first electrically conductive layer and the second electrically conductive layer are electrically isolated from each other.

17. The method of claim 15, further comprising:
forming a first electrical contact in the core, the first electrical contact electrically coupling the second metal layer and the first electrically conductive layer; and
forming a second electrical contact into the core, the second electrical contact electrically coupling the first metal layer and the second electrically conductive layer, wherein the first electrical contact is electrically isolated from the second electrical contact.

18. The method of claim 10, wherein the core is a selected one of: a glass core or a silicon core.

19. The method of claim 10, wherein applying the dielectric layer further includes applying the dielectric layer using atomic layer deposition (ALD).

20. The method of claim 10, wherein the first metal layer, the second metal layer, or the electrically conductive layer include copper.

21. A system comprising:
a substrate;
a first electrical connector coupled with the substrate;
a second electrical connector coupled with the substrate;
a capacitor coupled with the substrate, the capacitor comprising:
a first metal layer with a first side and a second side opposite the first side;
a perovskite layer with a first side and a second side opposite the first side, the first side of the perovskite layer physically coupled with the second side of the first metal layer;
a second metal layer with a first side and a second side opposite the first side, the first side of the second metal layer physically coupled with the second side of the perovskite layer, wherein the first metal layer and the second metal layer are electrically isolated from each other by the perovskite layer, and wherein the second metal layer has an end that extends laterally beyond an end of the first metal layer;
a first electrically conductive layer coupled with the second side of the second metal layer, the electrically conductive layer electrically coupled with the first electrical connector; and
a second electrically conductive layer coupled with the first side of the first metal layer, wherein the second electrically conductive layer is electrically coupled with the second electrical connector.

22. The system of claim 21, wherein the first metal layer, the perovskite layer, and the second metal layer form a plurality of trenches; and wherein a spacing between troughs of the plurality of trenches is 1um or less.

23. The system of claim 21, wherein the first electrically conductive layer uniformly covers the second metal layer, and wherein the second electrically conductive layer uniformly covers the first metal layer, and wherein the first electrically conductive layer and the second electrically conductive layer are electrically isolated.

24. The system of claim 21, wherein the perovskite layer includes a selected one or more of: strontium, barium, hafnium, zirconium, aluminum, cobalt, lanthanum, tin, oxygen, SrTiO3, BaTiO3, BaHfO3, BaZrO3, LaAl03, LaCoO3, or SrSnO3; and wherein the first metal layer or the second metal layer included a selected one of: ruthenium, molybdenum, rhodium, tungsten, platinum, rhenium, and oxygen.

* * * * *